US011380662B2

(12) United States Patent
Wang

(10) Patent No.: US 11,380,662 B2
(45) Date of Patent: Jul. 5, 2022

(54) DISPLAY BACKPLANE AND MANUFACTURING METHOD THEREOF, DISPLAY MOTHER-SUBSTRATE, AND DISPLAY PANEL

(71) Applicant: BOE TECHNOLOGY GROUP CO., LTD., Beijing (CN)

(72) Inventor: Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/973,162

(22) PCT Filed: Mar. 5, 2020

(86) PCT No.: PCT/CN2020/078002
§ 371 (c)(1),
(2) Date: Dec. 8, 2020

(87) PCT Pub. No.: WO2021/174488
PCT Pub. Date: Sep. 10, 2021

(65) Prior Publication Data

US 2022/0059516 A1 Feb. 24, 2022

(51) Int. Cl.

| | |
|---|---|
| ***H01L 25/16*** | (2006.01) |
| ***H01L 27/12*** | (2006.01) |
| ***H01L 33/62*** | (2010.01) |
| ***G02F 1/1335*** | (2006.01) |
| ***G02F 1/13357*** | (2006.01) |

(52) U.S. Cl.
CPC .......... *H01L 25/167* (2013.01); *H01L 27/124* (2013.01); *H01L 27/1259* (2013.01); *H01L 33/62* (2013.01); *G02F 1/133603* (2013.01); *G02F 1/133612* (2021.01)

(58) Field of Classification Search
None
See application file for complete search history.

(56) References Cited

U.S. PATENT DOCUMENTS

2007/0128777 A1* 6/2007 Yin .................. H01L 29/78696 438/151
2015/0001527 A1* 1/2015 Tsang ..................... H01L 27/15 257/43
2015/0325630 A1* 11/2015 Yoo ..................... H01L 51/5234 257/40

(Continued)

*Primary Examiner* — Bo B Jang
(74) *Attorney, Agent, or Firm* — Houtteman Law LLC

(57) ABSTRACT

The present disclosure provides a manufacturing method of a display backplane which includes a base substrate having first, second and third portions. The manufacturing method includes: forming a flexible layer extending from the first portion to and covering the second and third portions; forming a pixel driving circuit on the first portion and a backlight circuit on the third portion, wherein a part of a film layer of the pixel driving circuit extends from the first portion to and covers the second and third portions; removing a film layer on a side of the flexible layer away from the base substrate and on the second portion; separating the flexible layer from the second and third portions; removing the second and third portions; and bending a film layer separated from the third portion to a side of the first portion away from the flexible layer.

20 Claims, 6 Drawing Sheets

33 313 312 310 314 31 32 3 311 101 2 51 H1 103 5 1 H2 H1 52 102 41 42 43 4 44 45

(56) References Cited

U.S. PATENT DOCUMENTS

2016/0181346 A1* 6/2016 Kwon ................. H01L 27/3262 257/40
2019/0207130 A1* 7/2019 He ........................ H01L 51/003
2021/0343780 A1* 11/2021 Long ....................... H01L 33/62

* cited by examiner

DISPLAY BACKPLANE AND MANUFACTURING METHOD THEREOF, DISPLAY MOTHER-SUBSTRATE, AND DISPLAY PANEL

CROSS REFERENCE TO RELATED APPLICATION

The present application is a US National Stage of International Application No. PCT/CN2020/078002, filed on Mar. 5, 2020, which is hereby incorporated by reference in its entirety.

TECHNICAL FIELD

The embodiments of the present disclosure relate to the field of display technology, more particularly, to a display backplane and a manufacturing method thereof, a display mother-substrate and a display panel.

BACKGROUND

At present, the use of a light emitting diode (LED) light source as a backlight source of a liquid crystal display (LCD) display has become a mainstream approach in the field of LCD display. A traditional LED backlight board needs to be manufactured separately, and then a module process is performed with an LCD panel to integrate the LED backlight board with the LCD panel.

SUMMARY

The embodiments of the present disclosure provide a display backplane and a manufacturing method thereof, a display mother-substrate and a display panel.

In a first aspect, embodiments of the present disclosure provide a display backplane including: a base substrate having a first-side surface and a second-side surface opposite each other; a flexible layer on the base substrate, wherein the flexible layer wraps the first-side surface and extends to cover the second-side surface; a pixel driving circuit on the first-side surface; and a backlight circuit on the second-side surface; wherein the pixel driving circuit is on a side of the flexible layer away from the first-side surface, and the backlight circuit is on a side of the flexible layer away from the second-side surface.

In some embodiments, the pixel driving circuit includes a transistor, a second inorganic insulating layer, and a pixel electrode which are sequentially arranged away from the flexible layer; the transistor includes a gate electrode, a first inorganic insulating layer, an active layer, a first electrode, and a second electrode which are sequentially arranged away from the flexible layer; and the first electrode and the second electrode are arranged in a same layer and respectively arranged at two ends of the active layer, and are respectively coupled with the active layer; and the first electrode is coupled with the pixel electrode through a via hole provided in the second inorganic insulating layer.

In some embodiments, the backlight circuit includes a first electrode terminal, a first insulating layer, a second electrode terminal, a second insulating layer, and a light emitting diode (LED) which are sequentially arranged away from the flexible layer; and the first electrode terminal is coupled with an anode of the LED through a via hole provided in the first insulating layer and the second insulating layer; and the second electrode terminal is coupled with a cathode of the LED through a via hole provided in the second insulating layer.

In some embodiments, the backlight circuit includes a first electrode terminal, a first insulating layer, a second electrode terminal, and a second insulating layer which are sequentially arranged away from the flexible layer; and the first electrode terminal is exposed through a via hole provided in the first insulating layer and the second insulating layer, and is configured to couple with an anode of an LED to be bound; and the second electrode terminal is exposed through a via hole provided in the second insulating layer, and is configured to couple with a cathode of the LED to be bound.

In some embodiments, the first electrode terminal and the gate electrode are formed from a same film layer; the first insulating layer and the first inorganic insulating layer are formed from a same film layer; the second electrode terminal, and the first and second electrodes are formed from a same film layer; and the second insulating layer and the second inorganic insulating layer are formed from a same film layer.

In some embodiments, the display backplane further includes a buffer layer; wherein the buffer layer includes a first part and a second part; the first part is arranged on the first-side surface of the base substrate, and is sandwiched between the flexible layer and the pixel driving circuit; and the second part is arranged on the second-side surface of the base substrate, and is sandwiched between the flexible layer and the backlight circuit.

In some embodiments, a part of the flexible layer that wraps the first-side surface of the base substrate has a same thickness as a part of the flexible layer that covers the second-side surface of the base substrate, and a part of the flexible layer that wraps a side surface of the base substrate has a larger thickness than the part of the flexible layer that wraps the first-side surface of the base substrate.

In some embodiments, junctions of the side surface of the base substrate wrapped with the flexible layer and the first-side and second-side surfaces are chamfered.

In a second aspect, embodiments of the present disclosure provide a display mother-substrate including multiple sub-substrates arranged in an array; wherein a sub-substrate of the multiple sub-substrates includes a base substrate; the base substrate has a first portion, a second portion, and a third portion which are arranged in a first direction in sequence and adjacent to each other; and a flexible layer is provided on the base substrate, and extends from the first portion to and covers the second portion and the third portion; wherein a pixel driving circuit is formed on the first portion and on a side of the flexible layer away from the base substrate; and a backlight circuit is formed on the third portion and on the side of the flexible layer away from the base substrate.

In some embodiments, the pixel driving circuit includes a transistor, a second inorganic insulating layer, and a pixel electrode which are sequentially arranged away from the flexible layer; the transistor includes a gate electrode, a first inorganic insulating layer, an active layer, a first electrode, and a second electrode which are sequentially arranged away from the flexible layer; the first inorganic insulating layer is between the gate electrode and the active layer; and the first electrode and the second electrode are arranged in a same layer and respectively arranged at two ends of the active layer, and are respectively coupled with the active layer; the first electrode is coupled with the pixel electrode through a via hole provided in the second inorganic insulating layer; and the second and first inorganic insulating layers extend to and cover the second portion and the third portion.

In some embodiments, the backlight circuit includes a first electrode terminal, a second electrode terminal, and a light emitting diode (LED) which are sequentially arranged away from the flexible layer; the first inorganic insulating layer is between the first electrode terminal and the second electrode terminal; and the second inorganic insulating layer is between the second electrode terminal and the LED; and the first electrode terminal is coupled with an anode of the LED through a via hole provided in the first inorganic insulating layer and the second inorganic insulating layer; and the second electrode terminal is coupled with a cathode of the LED through a via hole provided in the second inorganic insulating layer.

In some embodiments, the backlight circuit includes a first electrode terminal and a second electrode terminal which are sequentially arranged away from the flexible layer; the first inorganic insulating layer is between the first electrode terminal and the second electrode terminal; and the second inorganic insulating layer is on a side of the second electrode terminal away from the flexible layer; and the first electrode terminal is exposed through a via hole provided in the first inorganic insulating layer and the second inorganic insulating layer, and is configured to couple with an anode of an LED to be bound; and the second electrode terminal is exposed through a via hole provided in the second inorganic insulating layer, and is configured to couple with a cathode of the LED to be bound.

In some embodiments, the first electrode terminal and the gate electrode are made of a same material and arranged in a same layer; and the second electrode terminal and the first and second electrodes are made of a same material and arranged in a same layer.

In some embodiments, the display mother-substrate further includes a buffer layer extending from the first portion to and covering the second portion and the third portion; wherein the buffer layer on the first portion is sandwiched between the flexible layer and the pixel driving circuit; and the buffer layer on the third portion is sandwiched between the flexible layer and the backlight circuit.

In a third aspect, embodiments of the present disclosure provide a display panel which includes the above-mentioned display backplane, and further includes an opposite substrate, wherein the opposite substrate is assembled to the first-side surface of the display backplane.

In a fourth aspect, embodiments of the present disclosure provide a manufacturing method of a display backplane, the display backplane including a base substrate; and the base substrate having a first portion, a second portion, and a third portion which are arranged in a first direction in sequence and adjacent to each other; wherein the manufacturing method includes: forming a flexible layer on the base substrate, the flexible layer extending from the first portion to and covering the second portion and the third portion; forming a pixel driving circuit on the first portion and forming a backlight circuit on the third portion; wherein a part of a film layer of the pixel driving circuit extends from the first portion to and covers the second portion and the third portion; removing a film layer which is on a side of the flexible layer away from the base substrate and on the second portion; separating the flexible layer from the second and third portions of the base substrate; removing the second and third portions of the base substrate; and bending a film layer separated from the third portion to a side of the first portion of the base substrate away from the flexible layer.

In some embodiments, the second and third portions of the base substrate are removed by performing a cutting and splitting process; an orthographic projection of a separation cut-off line of the base substrate and the flexible layer on the base substrate is on the first portion, and a cutting line for cutting the base substrate is a boundary line between the first portion and the second portion; and a distance between the separation cut-off line and the cutting line ranges from 20 μm to 50 μm.

In some embodiments, the base substrate is cut from a side of the base substrate away from the flexible layer, with a cutting depth ranging from ⅗ to ⅘ of a thickness of the base substrate.

In some embodiments, after removing the second and third portions of the base substrate by performing the cutting and splitting process, a cut and split surface of the base substrate is chamfered.

In some embodiments, after removing the film layer which is on the side of the flexible layer away from the base substrate and on the second portion, and before separating the flexible layer from the second and third portions of the base substrate, the method further includes: forming a flexible filling layer on the base substrate, wherein the flexible filling layer is distributed on the second portion.

In some embodiments, after bending the film layer separated from the third portion to the side of the first portion of the base substrate away from the flexible layer, the method further includes: forming a flexible filling layer on the side of the flexible layer on the second portion away from the base substrate.

In some embodiments, forming the pixel driving circuit on the first portion includes: forming a transistor, a second inorganic insulating layer and a pixel electrode sequentially; and forming the transistor includes: forming a gate electrode, a first inorganic insulating layer, an active layer, a first electrode and a second electrode sequentially; wherein the first and second inorganic insulating layers extend to and cover the second and third portions; the first electrode and the second electrode are arranged in a same layer and respectively arranged at two ends of the active layer, and are respectively coupled with the active layer; and the first electrode is coupled with the pixel electrode through a via hole provided in the second inorganic insulating layer.

In some embodiments, forming the backlight circuit on the third portion includes: forming a first electrode terminal, a first insulating layer, a second electrode terminal, a second insulating layer sequentially; and bonding a light emitting diode (LED); wherein the first electrode terminal and the gate electrode are formed by using one patterning process; the first insulating layer is formed by extending the first inorganic insulating layer on the first portion to the third portion; the second electrode terminal, the first electrode and the second electrode are formed by using one patterning process; the second insulating layer is formed by extending the second inorganic insulating layer on the first portion to the third portion; and the first electrode terminal is coupled with an anode of the LED through a via hole provided in the first insulating layer and the second insulating layer; and the second electrode terminal is coupled with a cathode of the LED through a via hole provided in the second insulating layer.

In some embodiments, forming the backlight circuit on the third portion includes: forming a first electrode terminal, a first insulating layer, a second electrode terminal, a second insulating layer sequentially; wherein the first electrode terminal and the gate electrode are formed by using one patterning process; the first insulating layer is formed by extending the first inorganic insulating layer on the first portion to the third portion; the second electrode terminal, the first electrode and the second electrode are formed by using one patterning process; the second insulating layer is formed by extending the second inorganic insulating layer on the first portion to the third portion; and the first electrode terminal is exposed through a via hole provided in the first insulating layer and the second insulating layer, and is configured to couple with an anode of an LED to be bound; and the second electrode terminal is exposed through a via hole provided in the second insulating layer, and is configured to couple with a cathode of the LED to be bound.

In some embodiments, after forming the flexible layer on the base substrate, and before forming the pixel driving circuit on the first portion and forming the backlight circuit on the third portion, the method further includes: forming a buffer layer; wherein the buffer layer extends from the first portion to and covers the second and third portions.

BRIEF DESCRIPTION OF THE DRAWINGS

The accompanying drawings are used to provide a further understanding of the embodiments of the present disclosure, constitute a part of the specification, and are used to explain the present disclosure together with the embodiments of the present disclosure, but do not constitute a limitation to the present disclosure. By describing detailed exemplary embodiments with reference to the accompanying drawings, the above and other features and advantages will become more apparent to those skilled in the art. The drawings are as follows.

Figure 1:
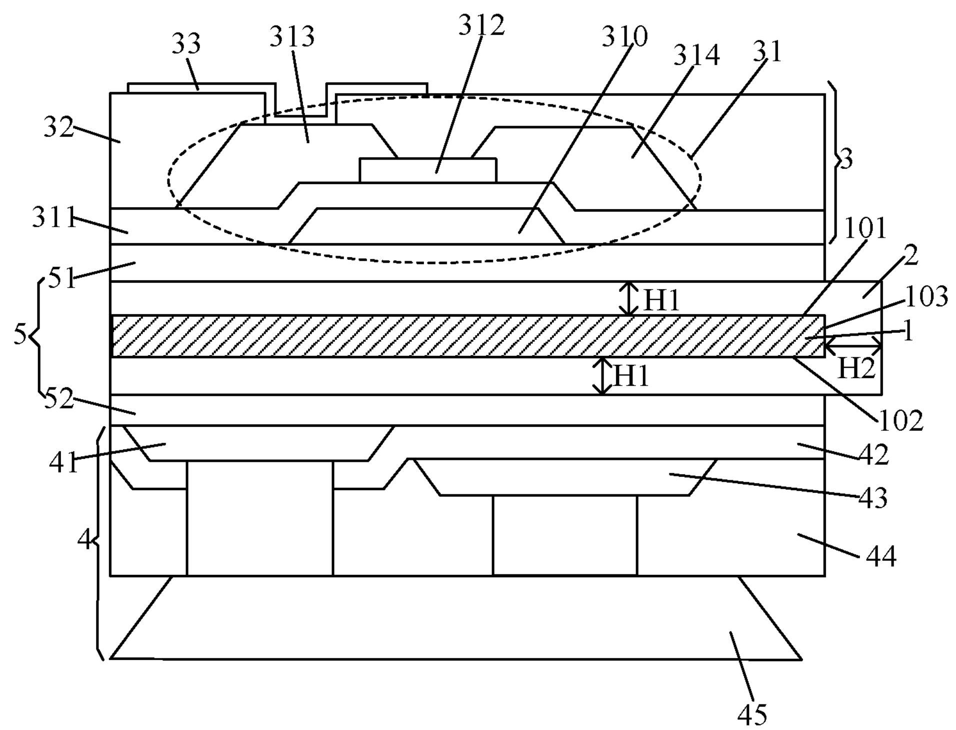
FIG. 1 is a cross-sectional view of a structure of a display backplane according to an exemplary embodiment of the present disclosure.

Reference signs are described as follows: a base substrate 1, a first-side surface 101, a second-side surface 102, a side surface 103, a flexible layer 2, a pixel driving circuit 3, a transistor 31, a gate electrode 310, a first inorganic insulating layer 311, an active layer 312, a first electrode 313, a second electrode 314, a second inorganic insulating layer 32, a pixel electrode 33, a backlight circuit 4, a first electrode terminal 41, a first insulating layer 42, a second electrode terminal 43, a second insulating layer 44, an LED 45, a buffer layer 5, a first part 51, a second part 52, a first portion 10, a second portion 11, a third portion 12, a first direction L, a flexible filling layer 6, a separation cut-off line P, a cutting line T, and a sub-substrate 7.

DETAILED DESCRIPTION

To make those skilled in the art better understand the technical solutions of the present disclosure, a display backplane and a manufacturing method thereof, a display mother-substrate and a display panel provided by the embodiments of the present disclosure will be further described in detail below in conjunction with the accompanying drawings and specific embodiments.

Hereinafter, the embodiments of the present disclosure will be more fully described with reference to the accompanying drawings, but the illustrated embodiments may be embodied in different forms, and should not be construed as the disclosure being limited to the embodiments set forth in the present disclosure. On the contrary, the purpose of providing these embodiments is to make the present disclosure thorough and complete, and to enable those skilled in the art to fully understand the scope of the present disclosure.

The embodiments of the present disclosure are not limited to the embodiments shown in the drawings, but include modifications of configurations based on manufacturing processes. Therefore, regions illustrated in the drawings have schematic properties; and shapes of the regions shown in the figures illustrate specific shapes of the regions, but are not intended to limit the shapes of the regions.

At present, the use of an LED light source as a backlight source of an LCD display has become a mainstream approach in the field of LCD display. A traditional LED backlight board needs to be manufactured separately, and then a module process is performed with an LCD panel to integrate the LED backlight board with the LCD panel. Due to the high cost of the LED backlight board itself, the separate production of the LED backlight board and the LCD panel, and the integration of the two, the manufacturing and device costs of the LCD display using the LED backlight source are greatly increased, which is not conducive to its market promotion and application.

In view of the above-mentioned problem of relatively high manufacturing and device costs of the LCD display using the LED backlight source, the exemplary embodiments of the present disclosure provide a display backplane and a manufacturing method thereof, a display mother-substrate and a display panel.

An exemplary embodiment of the present disclosure provides a display backplane. As shown in FIG. 1, the display backplane may include: a base substrate 1 having a first-side surface 101 and a second-side surface 102 opposite each other; a flexible layer 2 located on the base substrate 1, the flexible layer 2 wrapping the first-side surface 101 and extending to cover the second-side surface 102; a pixel driving circuit 3 located on the first-side surface 101; and a backlight circuit 4 located on the second-side surface 102. The pixel driving circuit 3 is located on a side of the flexible layer 2 away from the first-side surface 101, and the backlight circuit 4 is located on a side of the flexible layer 2 away from the second-side surface 102.

The base substrate 1 may be a glass base. The flexible layer 2 may be made of an organic resin material, such as polyimide. The flexible layer 2 has a certain degree of flexibility, and can assist in bending the backlight circuit 4 fabricated on the planar flexible layer 2 to the second-side surface 102 of the base substrate 1, during the manufacturing process. Compared to the existing solution of separately fabricating and then integrating the backlight board and the LCD panel, in the solution of this embodiment, it is no longer necessary to separately fabricate the backlight board containing the backlight circuit 4 and a display substrate containing the pixel driving circuit 3, and there is no need to integrate the display substrate containing the pixel driving circuit 3 and the backlight board containing the backlight circuit 4, thereby greatly reducing the device cost and manufacturing cost of the display backplane, which is more conducive to the market promotion and application of the display backplane.

In some embodiments, the pixel driving circuit 3 may include a transistor 31, a second inorganic insulating layer 32, and a pixel electrode 33 which are sequentially arranged away from the flexible layer 2. The transistor 31 may include a gate electrode 310, a first inorganic insulating layer 311, an active layer 312, a first electrode 313, and a second electrode 314 which are sequentially arranged away from the flexible layer 2. The first electrode 313 and the second electrode 314 are arranged in a same layer and respectively arranged at two ends of the active layer 312, and are respectively coupled with the active layer 312. The first electrode 313 is coupled with the pixel electrode 33 through a via hole provided in the second inorganic insulating layer 32. That is, the transistor 31 is a bottom-gate type transistor.

In some embodiments, the backlight circuit 4 may include a first electrode terminal 41, a first insulating layer 42, a second electrode terminal 43, a second insulating layer 44, and an LED 45 which are sequentially arranged away from the flexible layer 2. The first electrode terminal 41 is coupled with an anode of the LED 45 through a via hole provided in the first insulating layer 42 and the second insulating layer 44; and the second electrode terminal 43 is coupled with a cathode of the LED 45 through a via hole provided in the second insulating layer 44. The LED 45 may be a Mini LED or a Micro LED.

In some embodiments, the first electrode terminal 41 and the gate electrode 310 are formed from a same film layer; the first insulating layer 42 and the first inorganic insulating layer 311 are formed from a same film layer; the second electrode terminal 43, and the first and second electrodes 313 and 314 are formed from a same film layer; and the second insulating layer 44 and the second inorganic insulating layer 32 are formed from a same film layer. That is, during the fabrication of the display backplane, the first electrode terminal 41 and the gate electrode 310 may be fabricated and formed by one process; the first insulating layer 42 and the first inorganic insulating layer 311 may be fabricated and formed by one process; the second electrode terminal 43, the first electrode 313, and the second electrode 314 may be fabricated and formed by one process; and the second insulating layer 44 and the second inorganic insulating layer 32 may be fabricated and formed by one process, thereby greatly simplifying the manufacturing process of the pixel driving circuit 3 and backlight circuit 4. Compared to the existing solution of separately fabricating and then integrating the backlight board and the LCD panel, the manufacturing cost of the display backplane is further reduced.

In some embodiments, the display backplane may further include a buffer layer 5 including a first part 51 and a second part 52. The first part 51 is arranged on the first-side surface 101 of the base substrate 1, and is sandwiched between the flexible layer 2 and the pixel driving circuit 3. The second part 52 is arranged on the second-side surface 102 of the base substrate 1, and is sandwiched between the flexible layer 2 and the backlight circuit 4. The buffer layer 5 may be made of an inorganic insulating material, such as silicon oxide. On one hand, the buffer layer 5 can improve the adhesion of a metal conductive film layer fabricated thereon to it; and on the other hand, it can also protect the flexible layer 2 and prevent external moisture and oxygen from entering the flexible layer 2 and causing damage to it.

In some embodiments, a part of the flexible layer 2 that wraps the first-side surface 101 of the base substrate 1 has a same thickness H1 as a part of the flexible layer 2 that covers the second-side surface 102 of the base substrate 1; and a thickness H2 of a part of the flexible layer 2 that wraps a side surface 103 of the base substrate 1 is greater than the thickness H1 of the part of the flexible layer 2 that wraps the first-side surface 101 of the base substrate 1. The side surface 103 of the base substrate 1 refers to a side end surface of the base substrate 1 located between the first-side surface 101 and the second-side surface 102. In the case where the base substrate 1 is a cuboid, the base substrate 1 has four side surfaces. In this embodiment, one of the four side surfaces is wrapped by the flexible layer 2. In this way, the thickness of the part of the flexible layer 2 that wraps the side surface 103 of the base substrate 1 can be thickened, so that on one hand, the part of the flexible layer 2 that wraps the side surface 103 of the base substrate 1 is not easily broken, and on the other hand, it can prevent external moisture and oxygen from penetrating into the interior of the display backplane through the flexible layer 2, so as not to damage internal circuits of the display backplane.

In some embodiments, junctions of the side surface 103 of the base substrate 1 wrapped with the flexible layer 2 and the first-side and second-side surfaces 101 and 102 are chamfered. In this way, edges of the base substrate 1 can be made less sharp, thereby preventing the edges of the base substrate 1 from causing scratching and damage to the flexible layer 2 wrapping them.

Furthermore, in some embodiments, the first electrode terminal and the second electrode terminal of the backlight circuit may also be arranged in a same layer. The first electrode terminal may be coupled with the anode of the LED through a via hole provided in the first and second insulating layers; and the second electrode terminal may be coupled with the cathode of the LED through a via hole provided in the first and second insulating layers. Accordingly, the first and second electrode terminals and the gate electrode are formed from a same film layer.

In some embodiments, the transistor in the pixel driving circuit may also be a top-gate type transistor; that is, the gate electrode is located on a side of the active layer away from the base substrate. Accordingly, the first electrode terminal and the active layer are formed from a same film layer.

In some embodiments, the first electrode terminal and/or the second electrode terminal of the backlight circuit may also be formed with other conductive film layer(s) in the pixel driving circuit through one process, which is not limited here. Therefore, the manufacturing process of the pixel driving circuit and backlight circuit is greatly simplified. Compared to the existing solution of separately fabricating and then integrating the backlight board and the LCD panel, the manufacturing cost of the display backplane is further reduced.

In some embodiments, each of a driving chip of the pixel driving circuit and a driving chip of the backlight circuit may be arranged at an edge of any side of the display backplane, and the driving chips and a peripheral printed circuit board may also be bound according to a conventional bonding method. That is, the structural design of the display backplane described above will not affect the arrangement of each driving chip and its bonding with the peripheral printed circuit board. In addition, each driving chip may also be arranged at any edge of the second-side surface of the base substrate.

Figure 2:
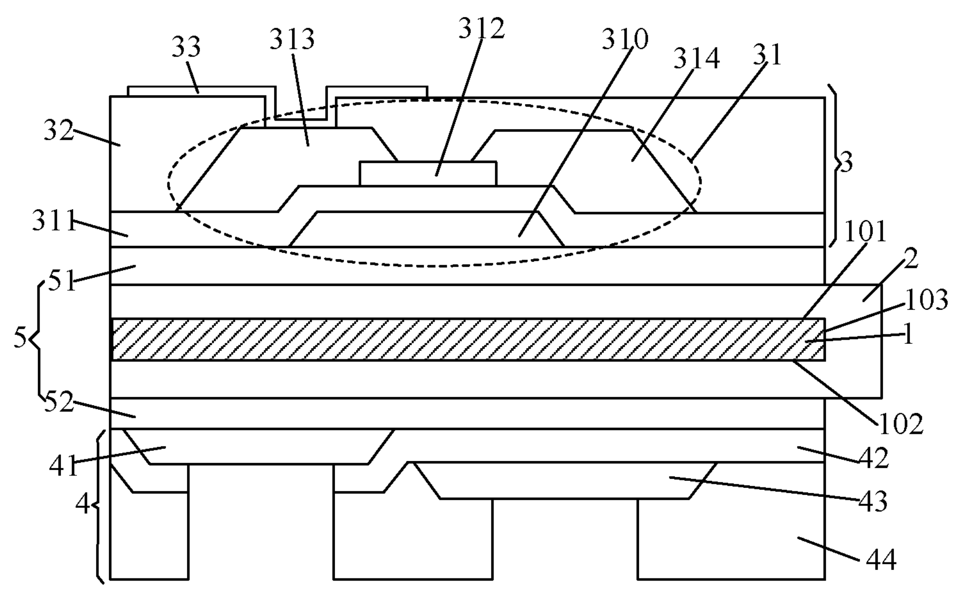
FIG. 2 is a cross-sectional view of a structure of another display backplane according to an exemplary embodiment of the present disclosure.

An exemplary embodiment of the present disclosure provides a display backplane. As shown in FIG. 2, the display backplane is different from the display backplane in the above-mentioned embodiments in that: the backlight circuit 4 includes the first electrode terminal 41, the first insulating layer 42, the second electrode terminal 43, and the second insulating layer 44 which are sequentially arranged away from the flexible layer 2; the first electrode terminal 41 is exposed through a via hole provided in the first insulating layer 42 and the second insulating layer 44, and is configured to couple with an anode of an LED to be bound; and the second electrode terminal 43 is exposed through a via hole provided in the second insulating layer 44, and is configured to couple with a cathode of the LED to be bound.

In this embodiment, the backlight circuit 4 does not include an LED. The LED is fabricated after the display backplane is fabricated.

The other structures of the display backplane in this embodiment is the same as that in the foregoing embodiments, and will not be repeated here.

The display backplane provided in the above exemplary embodiments is provided with a flexible layer, the flexible layer wraps the first-side surface and extends to cover the second-side surface, the pixel driving circuit is arranged above the flexible layer wrapping the first-side surface, and the backlight circuit is arranged above the flexible layer wrapping the second-side surface, which can assist in bending the backlight circuit fabricated on the planar flexible layer to the second-side surface side of the base substrate, during the manufacturing process. Compared to the existing solution of separately fabricating and then integrating the backlight board and the LCD panel, in the solution of this embodiment, it is no longer necessary to separately fabricate the backlight board containing the backlight circuit and the display substrate containing the pixel driving circuit, and there is no need to integrate the display substrate containing the pixel driving circuit and the backlight board containing the backlight circuit, thereby greatly reducing the device cost and manufacturing cost of the display backplane, which is more conducive to the market promotion and application of the display backplane.

Based on the above structures of the display backplane, an exemplary embodiment of the present disclosure provides a manufacturing method of the display backplane. As shown in FIGS. 3-11, the display backplane includes a base substrate 1; and the base substrate 1 has a first portion 10, a second portion 11, and a third portion 12 which are arranged in a first direction L in sequence and adjacent to each other. The manufacturing method may include steps S1-S6.

Figure 3:
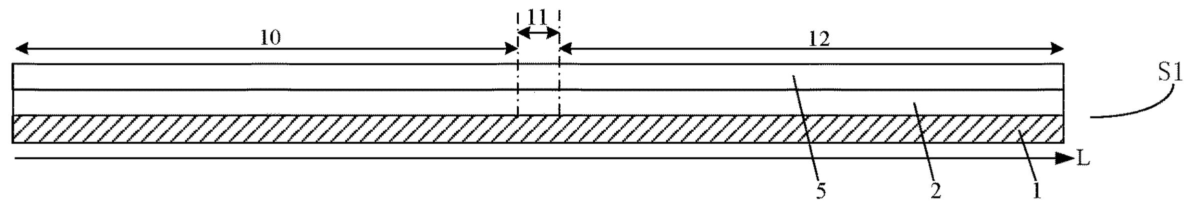
FIG. 3 is a cross-sectional view of a structure of a display backplane after completing step S1 in a manufacturing method of a display backplane according to an exemplary embodiment of the present disclosure.

In step S1, a flexible layer 2 is formed on the base substrate 1. The flexible layer 2 extends from the first portion 10 to and covers the second portion 11 and the third portion 12, as shown in FIG. 3.

In some embodiments, after the flexible layer 2 is formed on the base substrate 1, the method further includes: forming a buffer layer 5. The buffer layer 5 extends from the first portion 10 to and covers the second portion 11 and the third portion 12. The buffer layer 5 is made of an inorganic insulating material, such as silicon oxide. The buffer layer 5 may be fabricated by a traditional patterning process. On one hand, the buffer layer 5 can improve the adhesion of a metal conductive film layer fabricated thereon to it; and on the other hand, it can also protect the flexible layer 2 and prevent external moisture and oxygen from entering the flexible layer 2 and causing damage to it.

Figure 4:
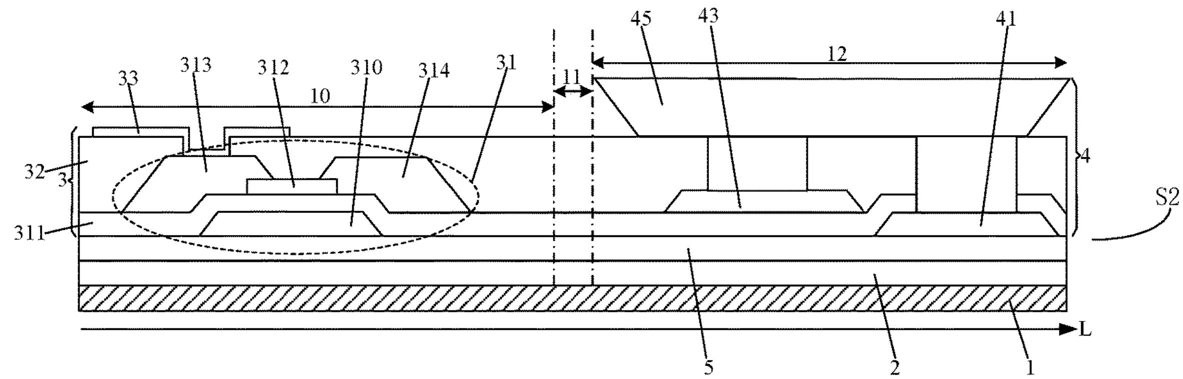
FIG. 4 is a cross-sectional view of a structure of a display backplane after completing step S2 in a manufacturing method of a display backplane according to an exemplary embodiment of the present disclosure.

In step S2, a pixel driving circuit 3 is formed on the first portion 10 and a backlight circuit 4 is formed on the third portion 12. A part of a film layer of the pixel driving circuit 3 extends from the first portion 10 to and covers the second portion 11 and the third portion 12, as shown in FIG. 4.

Figure 5:
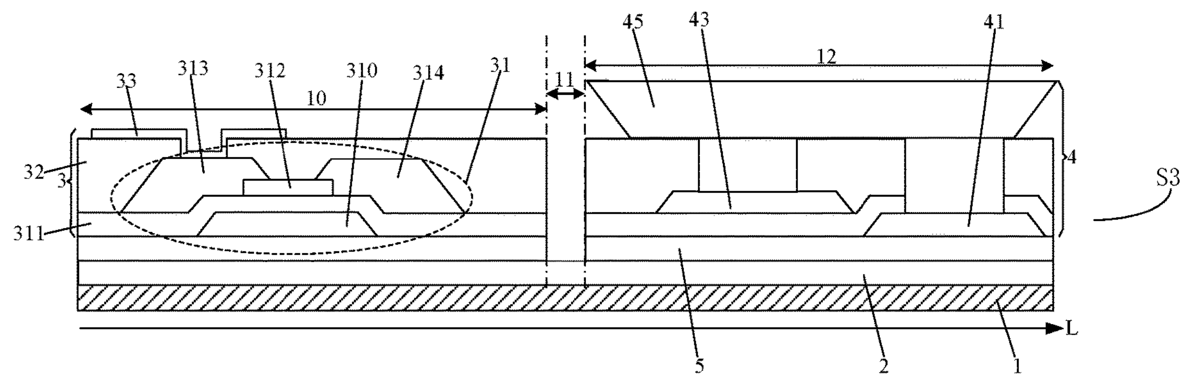
FIG. 5 is a cross-sectional view of a structure of a display backplane after completing step S3 in a manufacturing method of a display backplane according to an exemplary embodiment of the present disclosure.

In step S3, a film layer which is on a side of the flexible layer 2 away from the base substrate 1 and on the second portion 11 is removed, as shown in FIG. 5.

Figure 6:
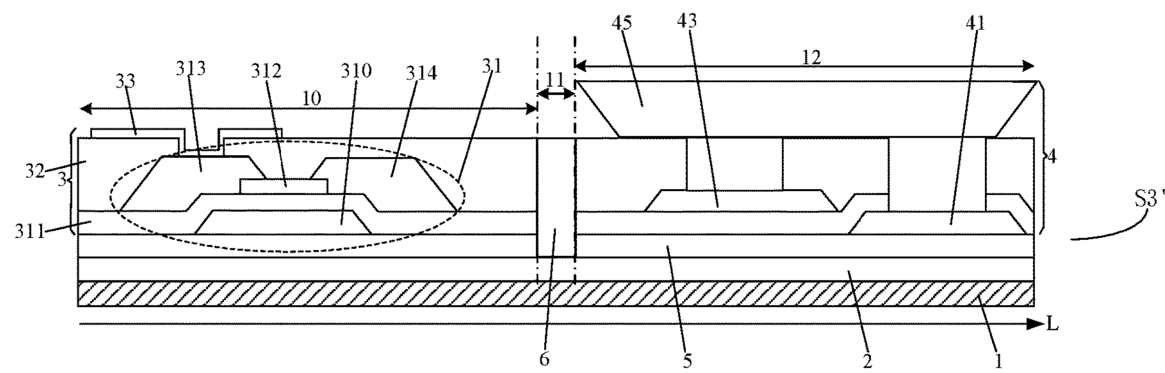
FIG. 6 is a cross-sectional view of a structure of a display backplane after completing step S3' in a manufacturing method of a display backplane according to an exemplary embodiment of the present disclosure.

The manufacturing method may further include step S3', in which a flexible filling layer 6 is formed on the base substrate 1. The flexible filling layer 6 is distributed on the second portion 11, as shown in FIG. 6.

The flexible filling layer 6 may be made of a same organic resin material as the flexible layer 2, such as polyimide. The formation of the flexible filling layer 6 can increase a thickness of a part of the flexible layer 2 on the second portion 11, and the part of the flexible layer 2 on the second portion 11 is subsequently used for wrapping a side surface of the base substrate 1. Therefore, on one hand, the part of the flexible layer 2 that wraps the side surface of the base substrate 1 is not easily broken, and on the other hand, it can prevent external moisture and oxygen from penetrating into the interior of the display backplane through the flexible layer 2, so as not to damage internal circuits of the display backplane.

In step S4, the flexible layer 2 is separated from the second portion 11 and the third portion 12 of the base substrate 1.

Figure 7:
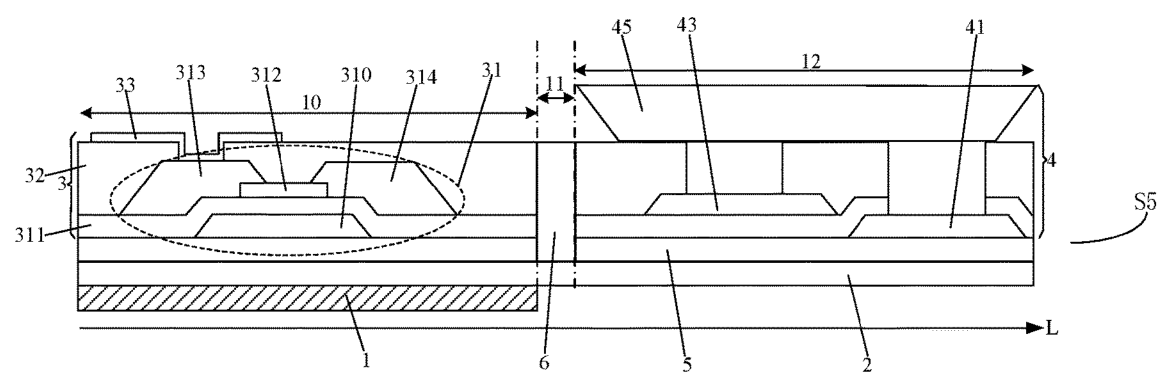
FIG. 7 is a cross-sectional view of a structure of a display backplane after completing step S5 in a manufacturing method of a display backplane according to an exemplary embodiment of the present disclosure.

In step S5, the second portion 11 and the third portion 12 of the base substrate 1 is removed, as shown in FIG. 7.

The step S5 may include: removing the second portion 11 and the third portion 12 of the base substrate 1 by performing a cutting and splitting process.

Figure 8:
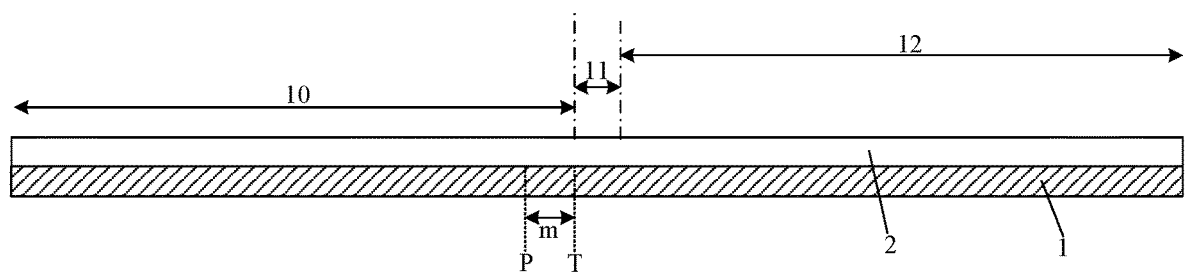
FIG. 8 is a schematic diagram showing a position of a separation cut-off line of a base substrate and a flexible layer and a position of a cutting line for cutting the base substrate, in a manufacturing method of a display backplane according to an exemplary embodiment of the present disclosure.

As shown in FIG. 8, in the steps S4 and S5, an orthographic projection of a separation cut-off line P of the base substrate 1 and the flexible layer 2 on the base substrate 1 is on the first portion 10, and a cutting line T for cutting the base substrate 1 is a boundary line between the first portion 10 and the second portion 11; and a distance m between the separation cut-off line P and the cutting line T ranges from 20 μm to 50 μm. For example, in this embodiment, the distance m between the separation cut-off line P and the cutting line T is 30 μm. That is, the separation cut-off line P exceeds the cutting line T by a distance in a direction towards the first portion 10. Due to this arrangement, with a relatively limited separation accuracy, it not only can ensure that the base substrate 1 and the flexible layer 2 are separated at the cutting line T, but also can prevent the first portion 10 of the base substrate 1 and the flexible layer 2 from being separated, thereby ensuring the bending effect of the flexible layer 2 in the subsequent process.

Figure 9:
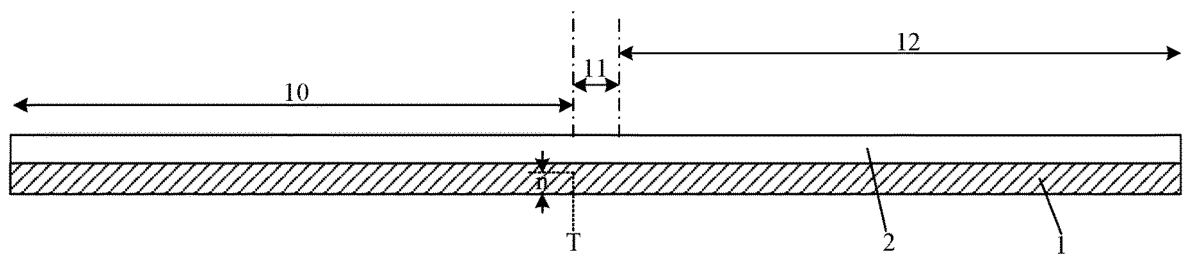
FIG. 9 is a schematic diagram showing a cutting depth of a base substrate in a manufacturing method of a display backplane according to an exemplary embodiment of the present disclosure.

In some embodiments, as shown in FIG. 9, the base substrate 1 may be cut from a side of the base substrate 1 away from the flexible layer 2, and a cutting depth n of the base substrate 1 may range from ⅗ to ⅘ of a thickness of the base substrate 1. Such cutting can not only avoid defective splitting caused by a too shallow cutting depth, but also avoid a cutting damage to the flexible layer 2 caused by a too deep cutting depth.

Figure 10:
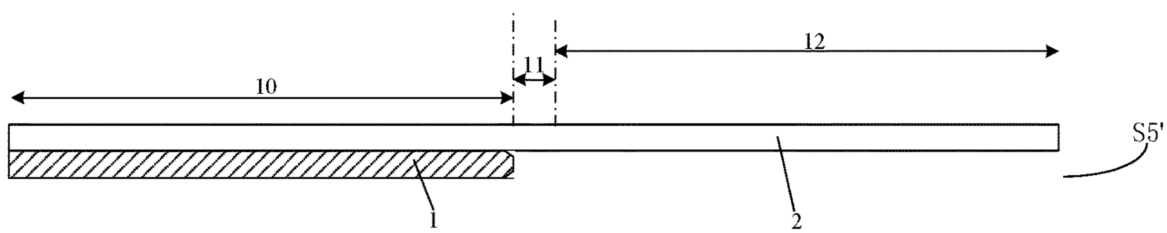
FIG. 10 is a cross-sectional view of a structure of a display backplane after completing step S5' in a manufacturing method of a display backplane according to an exemplary embodiment of the present disclosure.

After removing the second portion 11 and the third portion 12 of the base substrate 1 by performing the cutting and splitting process, the manufacturing method may further include step S5', in which a cut and split surface of the base substrate 1 is chamfered, as shown in FIG. 10.

In this step, a mechanical grinding method may be used to chamfer the cut and split surface of the base substrate 1. For example, a grinding wheel or another grinding wheel may be used to chamfer the cut and split surface of the base substrate 1, so that edges and corners of the cut and split surface of the base substrate 1 tend to be smooth, and avoid sharp edges and corners to cause scratch damage to the flexible layer 2.

Figure 11:
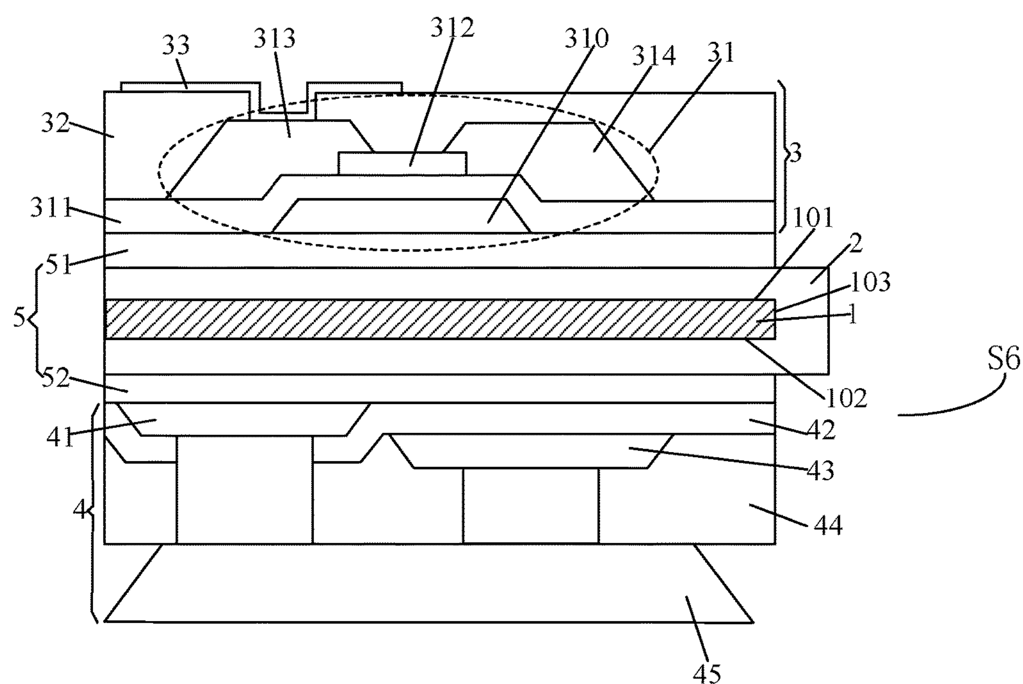
FIG. 11 is a cross-sectional view of a structure of a display backplane after completing step S6 in a manufacturing method of a display backplane according to an exemplary embodiment of the present disclosure.

In step S6, a film layer separated from the third portion 12 is bent to a side of the first portion 10 of the base substrate 1 away from the flexible layer 2, as shown in FIG. 11.

In some embodiments, after bending the film layer separated from the third portion to the side of the first portion of the base substrate 1 away from the flexible layer 2, a flexible filling layer may be formed on a side of the part of the flexible layer on the second portion away from the base substrate. This is also to increase the thickness of the part of the flexible layer on the second portion, and the part of the flexible layer on the second portion wraps the side surface of the base substrate. Therefore, on one hand, the part of the flexible layer that wraps the side surface of the base substrate is not easily broken, and on the other hand, it can prevent external moisture and oxygen from penetrating into the interior of the display backplane through the flexible layer, so as not to damage the internal circuits of the display backplane.

In some embodiments, forming the pixel driving circuit 3 on the first portion 10 may include: forming a transistor 31, a second inorganic insulating layer 32 and a pixel electrode 33 sequentially. Forming the transistor 31 may include: forming a gate electrode 310, a first inorganic insulating layer 311, an active layer 312, a first electrode 313 and a second electrode 314 sequentially. The first and second inorganic insulating layers 311 and 32 extend to and cover the second and third portions 11 and 12. The first electrode 313 and the second electrode 314 are arranged in a same layer and respectively arranged at two ends of the active layer 312, and are respectively coupled with the active layer 312. The first electrode 313 is coupled with the pixel electrode 33 through a via hole provided in the second inorganic insulating layer 32.

Respective film layers of the pixel driving circuit 3 may be fabricated by using a traditional and mature process, such as a patterning process including all or part of the steps of film formation, photoresist coating, exposure, development, etching, and cleaning, which will not be repeated herein.

In some embodiments, forming the backlight circuit 4 on the third portion 12 may include: forming a first electrode terminal 41, a first insulating layer, a second electrode terminal 43, a second insulating layer sequentially, and bonding an LED 45. The first electrode terminal 41 and the gate electrode 310 may be formed by using one patterning process. The first insulating layer may be formed by extending the first inorganic insulating layer 311 on the first portion 10 to the third portion 12. The second electrode terminal 43, the first electrode 313 and the second electrode 314 may be formed by using one patterning process. The second insulating layer may be formed by extending the second inorganic insulating layer 32 on the first portion 10 to the third portion 12. The first electrode terminal 41 is coupled with an anode of the LED 45 through a via hole provided in the first insulating layer and the second insulating layer. The second electrode terminal 43 is coupled with a cathode of the LED 45 through a via hole provided in the second insulating layer.

The fabrication of each film layer of the backlight circuit 4 and the corresponding film layer of the pixel driving circuit 3 is completed through one process, thereby greatly simplifying the manufacturing process of the pixel driving circuit 3 and backlight circuit 4. Compared to the existing solution of separately fabricating and then integrating the backlight board and the LCD panel, the manufacturing cost of the display backplane is further reduced.

In some embodiments, a surface mounted technology (SMT) process method may be used to fabricate the LED on the base substrate. Typically, an LED chip is picked up by a single robotic arm, and then placed directly on the third portion of the base substrate, and its anode and cathode are coupled with the first electrode terminal and the second electrode terminal, respectively. In an example, the process includes: a) chip expansion, that is, closely arranged LED chips on a blue film are expanded to have a suitable spacing for grasping; b) solder paste printing, that is, the solder paste is printed on a driving substrate (i.e., the third portion of the base substrate) by screen printing; c) bonding, that is, the LED chips are transferred from the blue film to the driving substrate one by one, and temporarily fixed on the electrode pads; and d) reflow soldering, that is, the driving substrate is transferred to a reflow oven, the solder is melted and then cooled, and the anode and cathode of the LED chip and the electrode pads are perfectly combined. The SMT process method is suitable for transferring Mini LEDs and fabricating them on a base substrate, and also suitable for transferring Micro LEDs having a larger size and fabricating them on a base substrate. In the case of a large number of LEDs, the large number of LEDs may also be transferred to the base substrate by means of mass transfer (MT). The process of transferring the LED to the base substrate is not limited to the above-mentioned methods, and there are many more mature process methods, which will not be repeated herein.

In some embodiments, when the transistor in the pixel driving circuit is a top-gate type transistor, the order of fabrications of some of the film layers may be adjusted; for example, the gate electrode is formed after the active layer is formed, and the first electrode terminal and the active layer are formed by one patterning process. However, the fabrication method of each layer remains unchanged.

In some embodiments, the first electrode terminal and the second electrode terminal of the backlight circuit may also be formed simultaneously in one patterning process. In addition, the first electrode terminal and the second electrode terminal of the backlight circuit may also be formed together with another conductive film layer of the pixel driving circuit through one process respectively, which is not limited herein. Therefore, the manufacturing process of the pixel driving circuit and backlight circuit is greatly simplified. Compared to the current solution of separately fabricating and then integrating the backlight board and the LCD panel, the manufacturing cost of the display backplane is further reduced.

An exemplary embodiment of the present disclosure provides a manufacturing method of a display backplane, which is different from the above-mentioned manufacturing method of the display backplane in that forming the backlight circuit on the third portion includes: forming a first electrode terminal, a first insulating layer, a second electrode terminal, a second insulating layer sequentially; where the first electrode terminal and the gate electrode may be formed by using one patterning process; the first insulating layer may be formed by extending the first inorganic insulating layer on the first portion to the third portion; and the second electrode terminal, the first electrode and the second electrode may be formed by using one patterning process. The second insulating layer may be formed by extending the second inorganic insulating layer on the first portion to the third portion; the first electrode terminal is exposed through a via hole provided in the first insulating layer and the second insulating layer, and is configured to couple with an anode of an LED to be bound; and the second electrode terminal is exposed through a via hole provided in the second insulating layer, and is configured to couple with a cathode of the LED to be bound.

In this embodiment, the LED is fabricated after the film layer separated from the third portion is bent to the back of the first portion. The fabrication of the LED may be achieved by the SMT process method. It should be noted that before using the SMT process method to fabricate the LED, a protective layer may be first formed on a side of the pixel driving circuit on the first portion away from the base substrate. The protective layer may be made of a material such as a resin material or optical transparent glue. The protective layer covers the entire first portion to protect the pixel driving circuit on the first portion. The protective layer may be fabricated by a coating or printing process, and may be removed by exposure, development or ashing process after the LED is fabricated.

The other steps of the manufacturing method of the display backplane in this embodiment are the same as those in the foregoing embodiments, and will not be repeated herein.

According to the manufacturing method of the display backplane provided in the above exemplary embodiments, the flexible layer is formed on the base substrate, the flexible layer extends from the first portion to and covers the second portion and the third portion, the pixel driving circuit is formed on the first portion, and the backlight circuit is formed on the third portion, thus the backlight circuit fabricated on the planar flexible layer can be bent to the back of the first portion. Compared to the existing solution of separately fabricating and then integrating the backlight board and the LCD panel, in the solution of this embodiment, it is no longer necessary to separately fabricate the backlight board containing the backlight circuit and the display substrate containing the pixel driving circuit, and there is no need to integrate the display substrate containing the pixel driving circuit and the backlight board containing the backlight circuit, thereby greatly reducing the device cost and manufacturing cost of the display backplane, which is more conducive to the market promotion and application of the display backplane.

Figure 12:
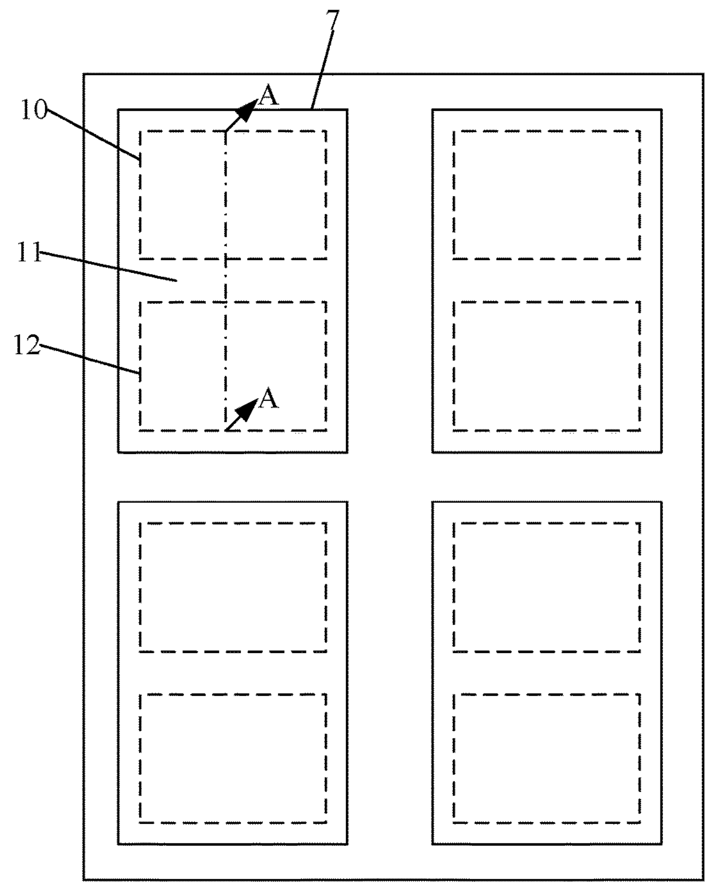
FIG. 12 is a top view of area division of a display mother-substrate according to an exemplary embodiment of the present disclosure.
Figure 13:
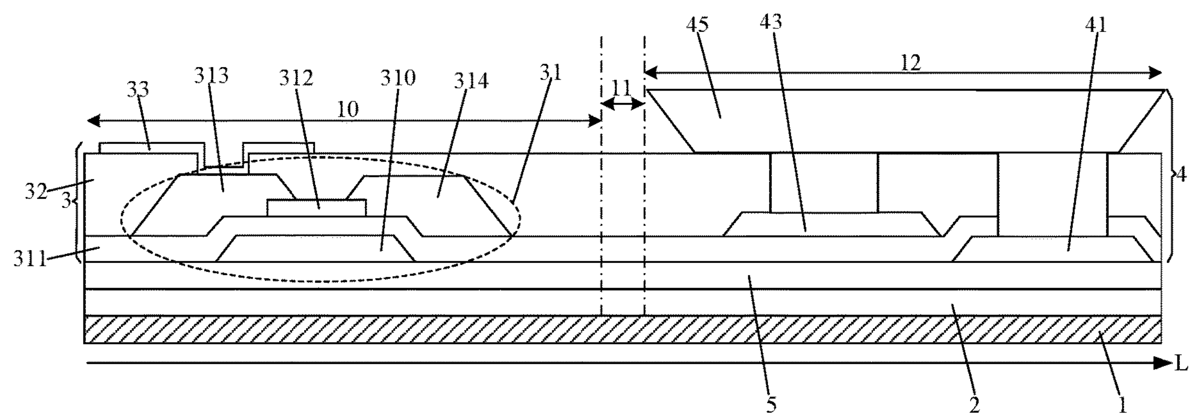
FIG. 13 is a cross-sectional view of a structure of the display mother-substrate shown in FIG. 12 taken along the line A-A.

Another exemplary embodiment of the present disclosure provides a display mother-substrate including multiple sub-substrates 7 arranged in an array, as shown in FIGS. 12 and 13. A sub-substrate 7 includes a base substrate 1; and the base substrate 1 has a first portion 10, a second portion 11, and a third portion 12 which are arranged in a first direction L in sequence and adjacent to each other. A flexible layer 2 is provided on the base substrate 1, and extends from the first portion 10 to and covers the second portion 11 and the third portion 12. A pixel driving circuit 3 is formed on the first portion 10 and located on a side of the flexible layer 2 away from the base substrate 1. A backlight circuit 4 is formed on the third portion 12 and located on the side of the flexible layer 2 away from the base substrate 1.

The base substrate 1 may be a glass base. The flexible layer 2 may be made of an organic resin material, such as polyimide. The flexible layer 2 has a certain degree of flexibility, and can assist in bending the backlight circuit 4 fabricated on the planar flexible layer 2 to the back of the base substrate 1 away from the pixel driving circuit 3, during the process of fabricating a display panel using the sub-substrate of the display mother-substrate. Compared to the existing solution of separately fabricating and then integrating the backlight board and the LCD panel, in the solution of this embodiment, it is no longer necessary to separately fabricate the backlight board containing the backlight circuit 4 and a display substrate containing the pixel driving circuit 3, and there is no need to integrate the display substrate containing the pixel driving circuit 3 and the backlight board containing the backlight circuit 4, thereby greatly reducing the device cost and manufacturing cost of the display panel using the sub-substrate 7 of the display mother-substrate, which is more conducive to the market promotion and application of the display panel using the sub-substrate 7 of the display mother-substrate.

In some embodiments, the pixel driving circuit 3 includes a transistor 31, a second inorganic insulating layer 32, and a pixel electrode 33 which are sequentially arranged away from the flexible layer 2. The transistor 31 includes a gate electrode 310, a first inorganic insulating layer 311, an active layer 312, a first electrode 313, and a second electrode 314 which are sequentially arranged away from the flexible layer 2. The first inorganic insulating layer 311 is located between the gate electrode 310 and the active layer 312. The first electrode 313 and the second electrode 314 are arranged in a same layer and respectively arranged at two ends of the active layer 312, and are respectively coupled with the active layer 312. The first electrode 313 is coupled with the pixel electrode 33 through a via hole provided in the second inorganic insulating layer 32. The second inorganic insulating layer 32 and the first inorganic insulating layer 311 extend to and cover the second portion 11 and the third portion 13.

In some embodiments, the backlight circuit 4 includes a first electrode terminal 41, a second electrode terminal 43, and an LED 45 which are sequentially arranged away from the flexible layer 2. The first inorganic insulating layer 311 is located between the first electrode terminal 41 and the second electrode terminal 43. The second inorganic insulating layer 32 is located between the second electrode terminal 43 and the LED 45. The first electrode terminal 41 is coupled with an anode of the LED 45 through a via hole provided in the first inorganic insulating layer 311 and the second inorganic insulating layer 32. The second electrode terminal 43 is coupled with a cathode of the LED 45 through a via hole provided in the second inorganic insulating layer 32.

In this embodiment, the fabrication of the LED on the base substrate may be achieved by the SMT process method described in the above embodiments. Of course, the LED may also be fabricated by other process methods, which will not be repeated herein.

In some embodiments, the first electrode terminal 41 and the gate electrode 310 are made of a same material and arranged in a same layer; and the second electrode terminal 43, the first electrode 313 and the second electrode 314 are made of a same material and arranged in a same layer. That is, during the fabrication process of the display mother-substrate, the first electrode terminal 41 and the gate electrode 310 can be fabricated and formed by one process, and the second electrode terminal 43, the first electrode 313 and the second electrode 314 can be fabricated and formed by one process, thereby greatly simplifying the manufacturing process of the pixel driving circuit 3 and backlight circuit 4. Compared to the existing solution of separately fabricating and then integrating the backlight board and the LCD panel, the manufacturing cost of the display panel using the sub-substrate 7 of the display mother-substrate is further reduced.

In some embodiments, the display mother-substrate may further include a buffer layer 5 extending from the first portion 10 to and covering the second portion 11 and the third portion 12. The buffer layer 5 on the first portion 10 is sandwiched between the flexible layer 2 and the pixel driving circuit 3; and the buffer layer 5 on the third portion 12 is sandwiched between the flexible layer 2 and the backlight circuit 4. The buffer layer 5 may be made of an inorganic insulating material, such as silicon oxide. On one hand, the buffer layer 5 can improve the adhesion of a metal conductive film layer fabricated thereon to it; and on the other hand, it can also protect the flexible layer 2 and prevent external moisture and oxygen from entering the flexible layer 2 and causing damage to it.

Furthermore, in some embodiments, the first electrode terminal and the second electrode terminal of the backlight circuit may also be arranged in a same layer. The first electrode terminal may be coupled with the anode of the LED through a via hole provided in the first and second insulating layers; and the second electrode terminal may be coupled with the cathode of the LED through another via hole provided in the first and second insulating layers. Accordingly, the first and second electrode terminals are made of a same material and are arranged in a same layer as the gate electrode.

In some embodiments, the transistor in the pixel driving circuit may also be a top-gate type transistor; that is, the gate electrode is located on a side of the active layer away from the base substrate. Accordingly, the first electrode terminal and the active layer are made of a same material and are arranged in a same layer.

In some embodiments, the first and/or second electrode terminals of the backlight circuit may also be formed with other conductive film layer(s) in the pixel driving circuit through one process, which is not limited here. Therefore, the manufacturing process of the pixel driving circuit and backlight circuit is greatly simplified. Compared to the existing solution of separately fabricating and then integrating the backlight board and the LCD panel, the manufacturing cost of the display panel using the sub-substrate of the display mother-substrate is further reduced.

Figure 14:
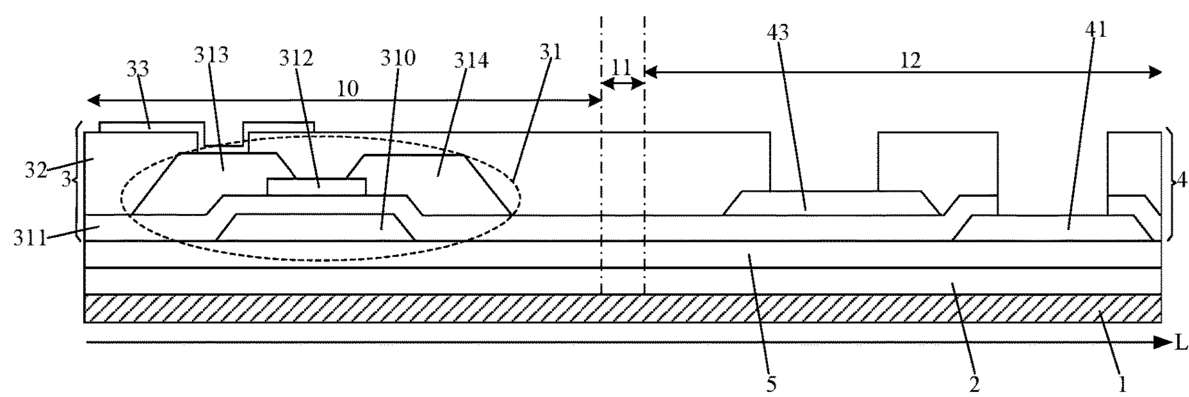
FIG. 14 is a cross-sectional view of a structure of another display mother-substrate according to an exemplary embodiment of the present disclosure taken along the line A-A shown in FIG. 12.

An exemplary embodiment of the present disclosure provides a display mother-substrate. As shown in FIG. 14, the display mother-substrate is different from the display mother-substrate in the above-mentioned embodiments in that the backlight circuit 4 includes the first electrode terminal 41 and the second electrode terminal 43 which are sequentially arranged away from the flexible layer 2; the first inorganic insulating layer 311 is located between the first electrode terminal 41 and the second electrode terminal 43; and the second inorganic insulating layer 32 is located on a side of the second electrode terminal 43 away from the flexible layer 2; the first electrode terminal 41 is exposed through a via hole provided in the first inorganic insulating layer 311 and the second inorganic insulating layer 32, and is configured to couple with an anode of an LED to be bound; and the second electrode terminal 43 is exposed through a via hole provided in the second inorganic insulating layer 32, and is configured to couple with a cathode of the LED to be bound.

In this embodiment, an LED bonding process is not performed on the display mother-substrate. The LED is bound during the fabrication of the display panel which uses the sub-substrate of the display mother-substrate.

The other structures of the display mother-substrate in this embodiment are the same as those in the foregoing embodiments, and will not be repeated here.

The display mother-substrate provided in the above exemplary embodiments is provided with the flexible layer, the flexible layer extends from the first portion to and covers the second portion and the third portion, the pixel driving circuit is formed on the first portion, and the backlight circuit is formed on the third portion, which can assist in bending the backlight circuit fabricated on the planar flexible layer to the back of the base substrate away from the pixel driving circuit, during the manufacturing process of the display panel using the sub-substrate of the display mother-substrate. Compared to the existing solution of separately fabricating and then integrating the backlight board and the LCD panel, it is no longer necessary to separately fabricate the backlight board containing the backlight circuit and the display substrate containing the pixel driving circuit, and there is no need to integrate the display substrate containing the pixel driving circuit and the backlight board containing the backlight circuit, thereby greatly reducing the device cost and manufacturing cost of the display panel using the sub-substrate of the display mother-substrate, which is more conducive to the market promotion and application of the display panel using the sub-substrate of the display mother-substrate.

An exemplary embodiment of the present disclosure provides a display panel, including the display backplane in the above embodiments, and further including an opposite substrate. The opposite substrate is assembled to the first-side surface of the display backplane.

The opposite substrate may be a color filter substrate. The color filter substrate and the display backplane are assembled to form the display panel integrated with a backlight board.

By adopting the display backplane in the above embodiments, the device cost and manufacturing cost of the display panel are greatly reduced, which is more beneficial to the market promotion and application of the display panel.

The display panel provided by the exemplary embodiment of the present disclosure may be any product or component with a display function, such as an LCD panel, an LCD TV, a display, a mobile phone, or a navigator.

It can be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements also fall within the protection scope of the present disclosure.

The invention claimed is:

1. A display backplane, comprising:

a base substrate having a first-side surface and a second-side surface opposite each other;

a flexible layer on the base substrate, wherein the flexible layer wraps the first-side surface and extends to cover the second-side surface;

a pixel driving circuit on the first-side surface; and a backlight circuit on the second-side surface; wherein the pixel driving circuit is on a side of the flexible layer away from the first-side surface, and the backlight circuit is on a side of the flexible layer away from the second-side surface.

2. The display backplane of claim 1, wherein the pixel driving circuit comprises a transistor, a second inorganic insulating layer, and a pixel electrode which are sequentially arranged away from the flexible layer;

the transistor comprises a gate electrode, a first inorganic insulating layer, an active layer, a first electrode, and a second electrode which are sequentially arranged away from the flexible layer; and the first electrode and the second electrode are arranged in a same layer and respectively arranged at two ends of the active layer, and are respectively coupled with the active layer; and the first electrode is coupled with the pixel electrode through a via hole provided in the second inorganic insulating layer.

3. The display backplane of claim 2, wherein the backlight circuit comprises a first electrode terminal, a first insulating layer, a second electrode terminal, a second insulating layer, and a light emitting diode (LED) which are sequentially arranged away from the flexible layer; and the first electrode terminal is coupled with an anode of the LED through a via hole provided in the first insulating layer and the second insulating layer, and the second electrode terminal is coupled with a cathode of the LED through a via hole provided in the second insulating layer; or the backlight circuit comprises a first electrode terminal, a first insulating layer, a second electrode terminal, and a second insulating layer which are sequentially arranged away from the flexible layer; the first electrode terminal is exposed through a via hole provided in the first insulating layer and the second insulating layer, and is configured to couple with an anode of an LED to be bound; and the second electrode terminal is exposed through a via hole provided in the second insulating layer, and is configured to couple with a cathode of the LED to be bound.

4. The display backplane of claim 3, wherein the first electrode terminal and the gate electrode are formed from a same film layer; the first insulating layer and the first inorganic insulating layer are formed from a same film layer; the second electrode terminal, and the first and second electrodes are formed from a same film layer; and the second insulating layer and the second inorganic insulating layer are formed from a same film layer.

5. The display backplane of claim 1, further comprising a buffer layer; wherein the buffer layer comprises a first part and a second part; the first part is arranged on the first-side surface of the base substrate, and is sandwiched between the flexible layer and the pixel driving circuit; and the second part is arranged on the second-side surface of the base substrate, and is sandwiched between the flexible layer and the backlight circuit.

6. The display backplane of claim 1, wherein a part of the flexible layer that wraps the first-side surface of the base substrate has a same thickness as a part of the flexible layer that covers the second-side surface of the base substrate, and a part of the flexible layer that wraps a side surface of the base substrate has a larger thickness than the part of the flexible layer that wraps the first-side surface of the base substrate.

7. The display backplane of claim 6, wherein junctions of the side surface of the base substrate, which is wrapped with the flexible layer, and the first-side and second-side surfaces of the base substrate are chamfered.

8. A display panel comprising the display backplane of claim 1, and further comprising an opposite substrate, wherein the opposite substrate is assembled to the first-side surface of the display backplane.

9. A display mother-substrate, comprising multiple sub-substrates arranged in an array; wherein a sub-substrate of the multiple sub-substrates comprises a base substrate; the base substrate has a first portion, a second portion, and a third portion which are arranged in a first direction in sequence and adjacent to each other; and a flexible layer is provided on the base substrate, and extends from the first portion to the second portion and the third portion and covers the second portion and the third portion; wherein a pixel driving circuit is formed on the first portion and on a side of the flexible layer away from the base substrate; and a backlight circuit is formed on the third portion and on the side of the flexible layer away from the base substrate.

10. The display mother-substrate of claim 9, wherein the pixel driving circuit comprises a transistor, a second inorganic insulating layer, and a pixel electrode which are sequentially arranged away from the flexible layer;

the transistor comprises a gate electrode, a first inorganic insulating layer, an active layer, a first electrode, and a second electrode which are sequentially arranged away from the flexible layer; the first inorganic insulating layer is between the gate electrode and the active layer; and the first electrode and the second electrode are arranged in a same layer and respectively arranged at two ends of the active layer, and are respectively coupled with the active layer;

the first electrode is coupled with the pixel electrode through a via hole provided in the second inorganic insulating layer; and the second and first inorganic insulating layers extend to and cover the second portion and the third portion.

11. The display mother-substrate of claim 10, wherein the backlight circuit comprises a first electrode terminal, a second electrode terminal, and a light emitting diode (LED) which are sequentially arranged away from the flexible layer; the first inorganic insulating layer is between the first electrode terminal and the second electrode terminal; the second inorganic insulating layer is between the second electrode terminal and the LED; the first electrode terminal is coupled with an anode of the LED through a via hole provided in the first inorganic insulating layer and the second inorganic insulating layer; and the second electrode terminal is coupled with a cathode of the LED through a via hole provided in the second inorganic insulating layer; or the backlight circuit comprises a first electrode terminal and a second electrode terminal which are sequentially arranged away from the flexible layer; the first inorganic insulating layer is between the first electrode terminal and the second electrode terminal; the second inorganic insulating layer is on a side of the second electrode terminal away from the flexible layer; the first electrode terminal is exposed through a via hole provided in the first inorganic insulating layer and the second inorganic insulating layer, and is configured to couple with an anode of an LED to be bound; and the second electrode terminal is exposed through a via hole provided in the second inorganic insulating layer, and is configured to couple with a cathode of the LED to be bound.

12. The display mother-substrate of claim 11, wherein the first electrode terminal and the gate electrode are made of a same material and arranged in a same layer; and the second electrode terminal and the first and second electrodes are made of a same material and arranged in a same layer.

13. The display mother-substrate of claim 9, further comprising a buffer layer extending from the first portion to the second portion and the third portion and covering the second portion and the third portion; wherein the buffer layer on the first portion is sandwiched between the flexible layer and the pixel driving circuit; and the buffer layer on the third portion is sandwiched between the flexible layer and the backlight circuit.

14. A manufacturing method of a display backplane, the display backplane comprising a base substrate; and the base substrate having a first portion, a second portion, and a third portion which are arranged in a first direction in sequence and adjacent to each other; wherein the manufacturing method comprises:

forming a flexible layer on the base substrate, the flexible layer extending from the first portion to the second portion and the third portion and covering the second portion and the third portion;

forming a pixel driving circuit on the first portion and forming a backlight circuit on the third portion; wherein a film layer of the pixel driving circuit extends from the first portion to the second portion and the third portion and covers the second portion and the third portion;

removing a part of the film layer of the pixel driving circuit which is on a side of the flexible layer away from the base substrate and on the second portion;

separating the flexible layer from the second and third portions of the base substrate;

removing the second and third portions of the base substrate; and bending a part of the flexible layer including the backlight circuit thereon separated from the third portion to a side of the first portion of the base substrate away from the flexible layer.

15. The manufacturing method of the display backplane of claim 14, wherein the second and third portions of the base substrate are removed by performing a cutting and splitting process;

an orthographic projection of a separation cut-off line of the base substrate and the flexible layer on the base substrate is on the first portion, and a cutting line for cutting the base substrate is a boundary line between the first portion and the second portion; and a distance between the separation cut-off line and the cutting line ranges from 20 μm to 50 μm.

16. The manufacturing method of the display backplane of claim 15, wherein after removing the second and third portions of the base substrate by performing the cutting and splitting process, a cut and split surface of the base substrate is chamfered.

17. The manufacturing method of the display backplane of claim 14, wherein the base substrate is cut from a side of the base substrate away from the flexible layer, with a cutting depth ranging from 3/5 to 4/5 of a thickness of the base substrate.

18. The manufacturing method of the display backplane of claim 14, wherein after removing the film layer which is on the side of the flexible layer away from the base substrate and on the second portion, and before separating the flexible layer from the second and third portions of the base substrate, the method further comprises: forming a first flexible filling layer on the base substrate, wherein the first flexible filling layer is distributed on the second portion; or after bending the part of the flexible layer including the backlight circuit thereon separated from the third portion to the side of the first portion of the base substrate away from the flexible layer, the method further comprises: forming a second flexible filling layer on the side of the flexible layer on the second portion away from the base substrate; or after forming the flexible layer on the base substrate, and before forming the pixel driving circuit on the first portion and forming the backlight circuit on the third portion, the method further comprises: forming a buffer layer; wherein the buffer layer extends from the first portion to the second and third portions and covers the second and third portions.

19. The manufacturing method of the display backplane of claim 14, wherein forming the pixel driving circuit on the first portion comprises: forming a transistor, a second inorganic insulating layer and a pixel electrode sequentially; and forming the transistor comprises: forming a gate electrode, a first inorganic insulating layer, an active layer, a first electrode and a second electrode sequentially;

wherein the first and second inorganic insulating layers extend to and cover the second and third portions; the first electrode and the second electrode are arranged in a same layer and respectively arranged at two ends of the active layer, and are respectively coupled with the active layer; and the first electrode is coupled with the pixel electrode through a via hole provided in the second inorganic insulating layer.

20. The manufacturing method of the display backplane of claim 19, wherein forming the backlight circuit on the third portion comprises: forming a first electrode terminal, a first insulating layer, a second electrode terminal, a second insulating layer sequentially; and bonding a light emitting diode (LED); wherein the first electrode terminal and the gate electrode are formed by using one patterning process; the first insulating layer is formed by extending the first inorganic insulating layer on the first portion to the third portion; the second electrode terminal, the first electrode and the second electrode are formed by using one patterning process; the second insulating layer is formed by extending the second inorganic insulating layer on the first portion to the third portion; and the first electrode terminal is coupled with an anode of the LED through a via hole provided in the first insulating layer and the second insulating layer; and the second electrode terminal is coupled with a cathode of the LED through a via hole provided in the second insulating layer; or forming the backlight circuit on the third portion comprises: forming a first electrode terminal, a first insulating layer, a second electrode terminal, a second insulating layer sequentially; wherein the first electrode terminal and the gate electrode are formed by using one patterning process; the first insulating layer is formed by extending the first inorganic insulating layer on the first portion to the third portion; the second electrode terminal, the first electrode and the second electrode are formed by using one patterning process; the second insulating layer is formed by extending the second inorganic insulating layer on the first portion to the third portion; and the first electrode terminal is exposed through a via hole provided in the first insulating layer and the second insulating layer, and is configured to couple with an anode of an LED to be bound; and the second electrode terminal is exposed through a via hole provided in the second insulating layer, and is configured to couple with a cathode of the LED to be bound.

* * * * *